(12) United States Patent
Jiang

(10) Patent No.: US 7,109,063 B2
(45) Date of Patent: Sep. 19, 2006

(54) SEMICONDUCTOR SUBSTRATE FOR BUILD-UP PACKAGES

(75) Inventor: Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 6 days.

(21) Appl. No.: 11/003,694

(22) Filed: Dec. 3, 2004

(65) Prior Publication Data

US 2005/0085014 A1    Apr. 21, 2005

Related U.S. Application Data

(62) Division of application No. 10/365,998, filed on Feb. 12, 2003.

(51) Int. Cl.
*H01L 23/48* (2006.01)

(52) U.S. Cl. .............. 438/118; 438/107; 257/782; 257/E23.042

(58) Field of Classification Search ........... 257/782, 257/783; 438/107, 118
See application file for complete search history.

(56) References Cited

U.S. PATENT DOCUMENTS

| | | |
|---|---|---|
| 3,903,590 A | 9/1975 | Yokogawa |
| 4,866,501 A | 9/1989 | Shanefield |
| 5,073,814 A | 12/1991 | Cole, Jr. et al. |
| 5,280,192 A | 1/1994 | Kryzaniwsky |
| 5,315,486 A | 5/1994 | Fillion et al. |
| 5,324,687 A | 6/1994 | Wojnarowski |
| 5,331,203 A | 7/1994 | Wojnarowski et al. |
| 5,432,677 A | 7/1995 | Mowatt et al. |
| 5,434,751 A | 7/1995 | Cole, Jr. et al. |
| 5,527,741 A | 6/1996 | Cole et al. |
| 5,546,654 A | 8/1996 | Wojnarowski et al. |
| 5,565,706 A | 10/1996 | Miura et al. |
| 5,745,984 A | 5/1998 | Cole, Jr. et al. |
| 5,757,072 A | 5/1998 | Gorowitz et al. |
| 5,808,874 A | 9/1998 | Smith |
| 5,837,427 A | 11/1998 | Hwang et al. |
| 5,841,193 A | 11/1998 | Eichelberger |
| 5,866,952 A * | 2/1999 | Wojnarowski et al. ...... 257/788 |
| 5,936,305 A | 8/1999 | Akram |
| 5,975,408 A | 11/1999 | Goossen |
| 6,000,127 A | 12/1999 | Eifuku et al. |
| 6,057,593 A | 5/2000 | Iovdalsky et al. |
| 6,159,767 A | 12/2000 | Eichelberger |
| 6,175,161 B1 | 1/2001 | Goetz et al. |
| 6,181,569 B1 | 1/2001 | Chakravorty |
| 6,202,298 B1 | 3/2001 | Smith |
| 6,214,642 B1 | 4/2001 | Chen et al. |
| 6,228,687 B1 | 5/2001 | Akram et al. |

(Continued)

*Primary Examiner*—Bradley K. Smith
(74) *Attorney, Agent, or Firm*—Schwegman, Lundberg, Woessner & Kluth, P.A.

(57) ABSTRACT

The present invention provides techniques to fabricate build-up single or multichip modules. In one embodiment, this is accomplished by dispensing die-attach material in one or more pre-etched cavities on a substrate. A semiconductor die is then placed over each pre-etched cavity including the die-attach material by urging a slight downward pressure on the substrate such that an active surface of each placed semiconductor die is disposed across from the substrate and is further substantially coplanar with the substrate. The semiconductor die is then secured to the substrate by curing the die-attach material. A miniature circuit board, including one or more alternating layer of dielectric material and metallization structures, is then formed over the substrate and the active surface of each semiconductor die to electrically interconnect the semiconductor dies.

42 Claims, 7 Drawing Sheets

U.S. PATENT DOCUMENTS

| | | |
|---|---|---|
| 6,236,109 B1 | 5/2001 | Hsuan et al. |
| 6,239,367 B1 | 5/2001 | Hsuan et al. |
| 6,274,391 B1 | 8/2001 | Wachtler et al. |
| 6,350,668 B1 | 2/2002 | Chakravorty |
| 6,365,438 B1 | 4/2002 | Ishida et al. |
| 6,368,896 B1 | 4/2002 | Farnworth et al. |
| 6,389,691 B1 | 5/2002 | Rinne et al. |
| 6,423,570 B1 | 7/2002 | Ma et al. |
| 6,437,240 B1 * | 8/2002 | Smith ................... 174/52.2 |
| 6,506,664 B1 | 1/2003 | Beyne et al. |
| 6,518,163 B1 | 2/2003 | Sakuyama et al. |
| 6,521,530 B1 | 2/2003 | Peters et al. |
| 6,555,906 B1 | 4/2003 | Wermer et al. |
| 6,617,687 B1 | 9/2003 | Akram et al. |
| 6,709,897 B1 | 3/2004 | Cheng et al. |
| 6,709,898 B1 | 3/2004 | Ma et al. |
| 6,734,534 B1 | 5/2004 | Vu et al. |
| 6,756,662 B1 | 6/2004 | Infantolino et al. |
| 6,867,499 B1 | 3/2005 | Tabrizi |
| 6,964,881 B1 | 11/2005 | Chua et al. |
| 2002/0004257 A1 * | 1/2002 | Takaoka et al. ............ 438/107 |
| 2004/0042190 A1 * | 3/2004 | Eng et al. ................. 361/795 |
| 2004/0043533 A1 | 3/2004 | Chua et al. |

* cited by examiner

SEMICONDUCTOR SUBSTRATE FOR BUILD-UP PACKAGES

This application is a Divisional of U.S. application Ser. No. 10/365,998, filed Feb. 12, 2003, which is incorporated herein by reference.

FIELD OF THE INVENTION

The present invention relates to semiconductor devices and, in particular, to single and multichip packages.

BACKGROUND OF THE INVENTION

The conventional approach to electronic packaging and interconnection has been to package individual integrated circuit (IC) chips in a single package and to attach these packages to a printed circuit board to provide interconnection between the individual IC chips. In recent years, this approach has met with problems of speed, size, and interconnection density due to ever constant demands for reduced size and increased performance from such integrated circuit packages.

One solution to many of the above problems is the multichip module (MCM). In an MCM, bare (unpackaged) IC chips are interconnected by means of a miniature printed circuit board whose interconnection pitch may match the pitch of the IC chip. There are presently two main classes of MCM. These are the "chips last MCM" and the "chips first MCM". In the chips last MCM, the miniature circuit board is fabricated first and then the bare IC chips are attached and interconnected to the circuit board. The method of interconnection is usually wire bond or solder bump. In the chips first MCM, the chips are placed and bonded to a substrate, and a miniature circuit board is then built above the chips. The method of interconnection, usually entails forming IC chips as an integral part of the processing of the circuit board. Currently, the industry uses build-up technology to interconnect IC chips in the chips first MCM. Build-up technology to interconnect IC chips in the chips first MCM is generally known. One such technique that is relevant to the present subject matter is discussed in U.S. Pat. No. 6,159,767.

As mentioned above, the chips first MCM requires placing the IC chips first relative to each other on a substrate. It is generally difficult to maintain consistency during placement and bonding of the IC chips onto a substrate. The inconsistencies in placing and bonding IC chips onto a substrate generally result in coplanarity and alignment problems between the IC chips and the substrate.

Generally, a thicker dielectric layer is required in forming the miniature circuit board over the IC chips to overcome the above-described inconsistency problems. The thicker the dielectric layer, the higher the thermal buildup and the mechanical stress generated during post-processing operations of the multichip module. In addition, the thickness of the dielectric layer formed over the IC chips can vary substantially due to coplanarity problems between the upper surfaces of the IC chips and the dielectric layer. In addition, the cost of raw material used in forming the dielectric layer increases due to its increased thickness. Further, variations in the thickness of the dielectric layer can cause changes in the dielectric properties, such as capacitance. Furthermore, variations in the thickness of the dielectric layer can cause post-processing problems, such as metal deposition rate, varying etch rate, metal coverage, and so on, which can ultimately result in a lower yield.

Thus, there is a need in the art for a technique to form MCMs using build-up technology that can overcome the above-described problems.

SUMMARY OF THE INVENTION

The present invention provides techniques for fabricating a multichip module using build-up technology.

In one aspect, the invention provides methods for forming a multichip module using build-up technology to interconnect semiconductor dies. In one embodiment of the methods, the multichip module is fabricated by dispensing die-attach material in one or more pre-etched cavities disposed on a substrate. A semiconductor die is then placed over each pre-etched cavity, including the die-attach material, by urging a slight downward pressure to place the semiconductor die to be substantially coplanar with the substrate. The semiconductor die is then secured to the substrate by curing the die-attach material. A miniature circuit board is then formed over the substrate and the secured semiconductor dies by forming a multilayer structure including alternating layers of dielectric and conductive materials that is substantially coplanar with the substrate to electrically interconnect the semiconductor dies.

In another aspect, the invention provides methods for forming a build-up multichip module on a silicon substrate. In one embodiment of the methods, the multichip module is formed by dispensing die-attach material in each of one or more first pre-etched cavities disposed on a substrate. An IC chip is then placed in each of one or more second pre-etched cavities that are associated with the one or more first pre-etched cavities such that each placed IC chip is disposed over the first pre-etched cavity including the die-attach material. A slight downward force is used while placing each IC chip over the first pre-etched cavities including the die-attach material so that each placed IC chip is substantially coplanar with the substrate. In addition, each IC chip is substantially accurately aligned by the walls of the second pre-etched cavity while placing the chip in the second pre-etched cavity. The placed IC chips are then secured to the substrate by curing the die-attach material. A dielectric layer is then formed over the substrate and the IC chips. Metallization structures are then formed over the dielectric material to electrically interconnect the IC chips.

In another aspect, the invention provides a multichip module. In one embodiment, the multichip module includes a substrate including one or more chip placement areas. Each chip placement area includes a pre-etched cavity. Each pre-etched cavity includes die-attach material. An IC chip overlies each chip placement area and over the die-attach material such that upper surfaces of the substrate and each IC chip are substantially coplanar. A miniature circuit board, including multiple layers of dielectric material and metallization structure, overlies the substrate and the IC chips to interconnect the IC chips.

In yet another aspect, the invention provides a multichip module. In one embodiment, the multichip module includes a substrate including one or more chip placement areas. Each chip placement area includes a pre-etched cavity and an associated alignment mark to aid in accurate alignment of a chip during placement of the chip over the chip placement area. Each cavity includes die-attach material. An IC chip overlies each of the one or more chip placement areas and the die-attach material such that the substrate and each IC chip are substantially coplanar. A miniature circuit board, including multiple alternating layers of dielectric material and metallization structures, overlies the substrate and the IC chips to interconnect the IC chips.

Additional advantages and features of the present invention will be more apparent from the detailed description and accompanying drawings, which illustrate preferred embodiments of the invention.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural, logical, electrical, and process changes may be made without departing from the teachings of the invention.

In the foregoing description of the preferred embodiments, various features of the invention are grouped together in a single embodiment for the purpose of streamlining the disclosure. This method of disclosure is not to be interpreted as reflecting an intention that the claimed invention requires more features than are expressly recited in each claim. Rather, as the following claims reflect, inventive aspects lie in less than all features of a single disclosed embodiment. Thus, the following claims are hereby incorporated into the description of the preferred embodiments, with each claim standing on its own as a separate preferred embodiment of the invention.

The term 'substrate' used in the following description may include materials, such as silicon, silicon-on insulator (SOI), silicon-on sapphire (SOS), doped and undoped semiconductors, epitaxial layers of silicon supported by a base semiconductor foundation, silica, ceramic, alumina, metals, organic materials, and other semiconductor structures. The semiconductor need not be silicon-based. The semiconductor could be silicon-germanium, germanium, or gallium arsenide. When reference is made to a wafer or substrate in the following description, previous process steps may be utilized to form regions, junctions, or layers in or on the base semiconductor or foundation.

The terms "semiconductive wafer fragment" or "wafer fragment" or "wafer" will be understood to mean any construction comprising semiconductor material, including but not limited to, bulk semiconductive materials, such as a semiconductor wafer (either alone or in assemblies comprising other material thereon) and a semiconductive material layer (either alone or in assemblies comprising other materials).

The terms "cavity", "well", and "pre-etched cavity" are used interchangeably throughout this specification. The term "active side" means the circuit side of a chip. The terms "chip", or "IC chip", or "semiconductor chip", or "semiconductor die" will be understood to mean an integrated circuit or other electronic component containing a semiconductor as a base material, and are used interchangeably throughout this specification.

The present invention provides techniques to fabricate a build-up single or multichip package. In some embodiments, the build-up multichip package may include a memory circuit including an array of memory cells disposed on a substrate and/or a logic circuit including an array of memory cells disposed on a substrate.

Figure 1:
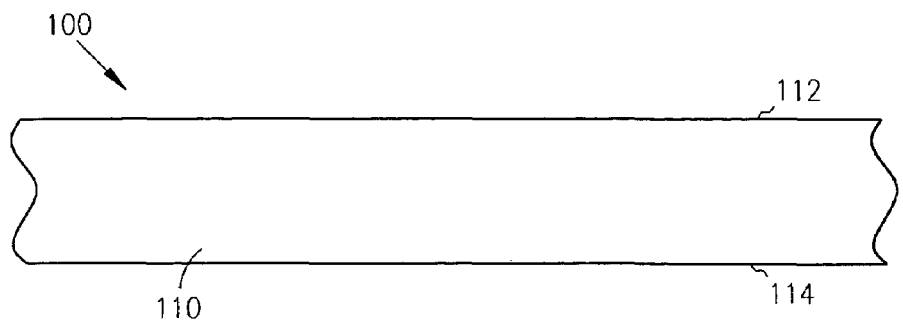
FIGS. 1, 2, 3, 4, 5, 7, 8, 9, 10, 11, and 12 are cross-sectional views of a semiconductor wafer fragment that illustrate sequential fabrication operations of a build-up multichip module according to an embodiment of the present invention.

FIGS. 1, 2, 3, 4, and 5 are cross-sectional views of a portion of semiconductor wafer fragment 100 illustrating one embodiment of sequential operations for forming one or more pre-etched cavities 140 on a substrate 110. The operation begins with a substrate 110 having top and bottom surfaces 112 and 114 as shown in FIG. 1. The substrate 110 can include semiconductor-based materials, such as silicon-on insulator (SOI), silicon-on sapphire (SOS), doped and undoped semiconductors, epitaxial layers of silicon supported by a base semiconductor foundation, silica, alumina, ceramic, and/or other semiconductor-based materials. The semiconductor-based materials can also include materials, such as silicon-germanium, germanium, and/or gallium arsenide.

Figure 2:
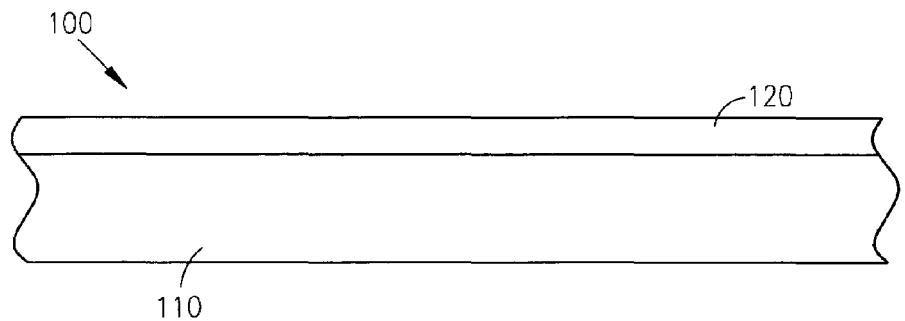
Figure 3:
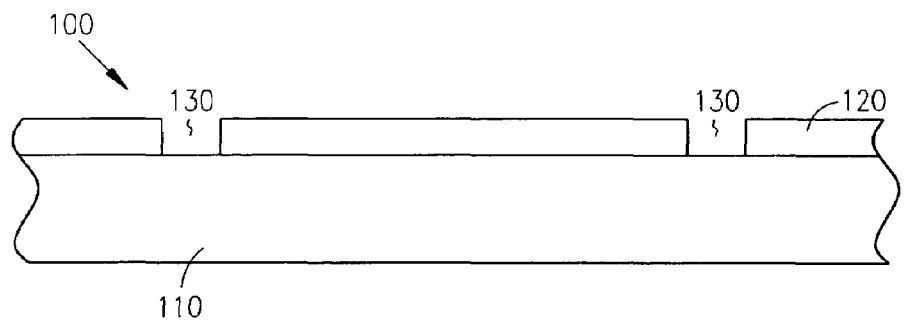
Figure 4:
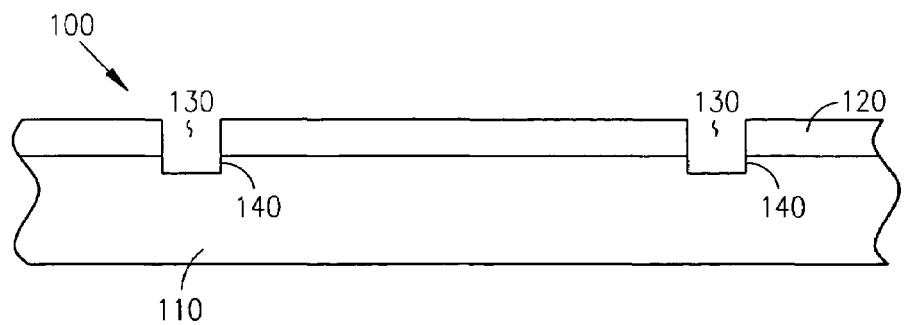

FIG. 2 illustrates deposition of a photoresist layer 120 to mask the top surface 112 of the substrate 110. A suitable photoresist layer comprises photoresist film JSR IX405 made by JSR Microelectronics. FIG. 3 illustrates exposing and developing photoresist layer 120 to form photoresist pattern 130. Photoresist pattern 130 can be developed based on desired shapes and locations for one or more pre-etched cavities 140 as shown in FIG. 4. One or more pre-etched cavities 140 can also be one or more wells.

FIG. 4 illustrates etching the photoresist layer 120 including photoresist pattern 130 using a solvent that is selective to photoresist layer 120 to form one or more pre-etched cavities 140. Solvents, such as KOH etchant, wet etchant, and/or dry etchant can be used to etch one or more pre-etched cavities 140. A suitable dry etch comprises exposing the photoresist layer 120 to $CF_4$ or $C_2F_6$, among others.

Figure 5:
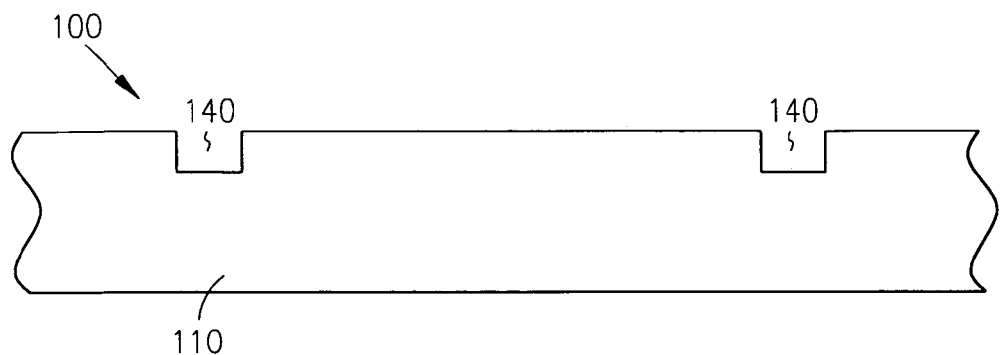

As depicted in FIG. 5, photoresist layer 120 is removed after etching the one or more pre-etched cavities 140, as shown in FIG. 4, to expose the formed one or more pre-etched cavities 140. A wet etchant, such as acetone or s photoresist stripper, such as Shipley's SVC-14 made by Strippers Corporation, among others can be used to remove the photoresist layer 120. Pre-etched cavities 140 can also be formed using other conventional processing techniques known to one skilled in the art.

Figure 6:
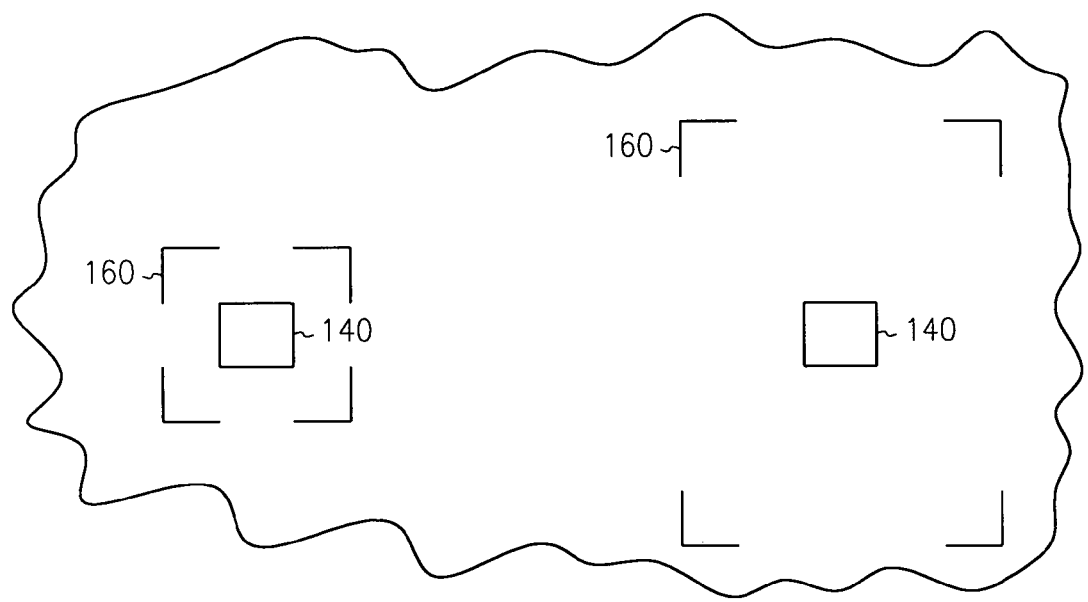
FIG. 6 is a top-down view of the semiconductor wafer fragment shown in FIG. 5.

FIG. 6 is a top view of semiconductor wafer fragment 100 shown in FIG. 5. FIG. 6 shows alignment marks 160 in addition to one or more pre-etched cavities 140 shown in FIG. 5. The alignment marks 160 are disposed around each of the one or more pre-etched cavities 140. Alignment marks 160 can also be formed using etching operations described above with reference to FIGS. 4 and 5. In these embodiments, alignment marks 160, such as those shown in FIG. 6, are used by pick-and-place machines to aid them in accurately aligning and placing the chips over the one or more pre-etched cavities 140. Alignment marks 160 help place the chips substantially accurately in both X and Y dimensions, as well as in holding the chip faces parallel in the same plane. Each of the alignment marks 160 is disposed at the outer boundaries of the chip placement area of an associated chip to be placed over a cavity 140 as shown in FIG. 6.

Figure 7:
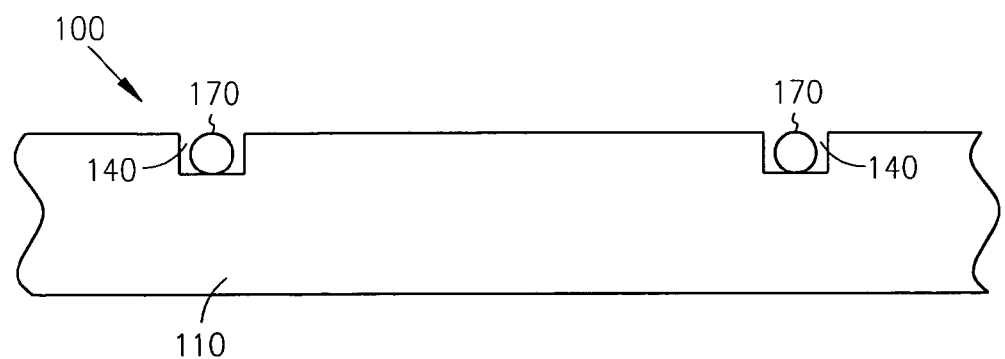

Referring to FIG. 7, die-attach material 170 is then dispensed in each of the one or more pre-etched cavities 140. The die-attach material 170 can include materials such as epoxy, polyimide, polyolefin, and BCB. A suitable die-attach material is a Dexter 536. The die-attach material 170 can be dispensed using processes, such as screen-printing, pneumatic dispensing, and positive dispensing. Dispensing equipment, such as a pick-and-place machine, a die-bonder, and/or die-attach equipment can be used to dispense the die-attach material. A suitable dispensing machine is a Datacom 2200 apm dispensing machine.

Figure 8:
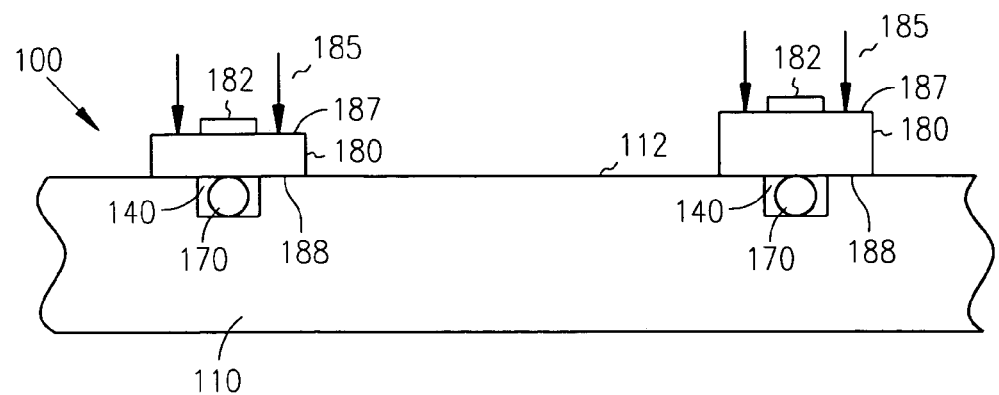

As shown in FIG. 8, a chip 180 is placed over each cavity 140, including die-attach material 170, with a slight downward force, as indicated by arrows 185, such that top surface 187 of each chip 180 is coplanar with the top surface 112 of substrate 110. In these embodiments, each chip 180 is placed over each cavity 140 such that the active surface is on top surface 187. The active surface 187 can include one or more contact pads 182. In some embodiments, each chip is accurately placed over each cavity using a high accuracy pick-and-place machine, such as the Datacom 2200apm. Exemplary chips 180 are semiconductor chips, semiconductor dies, semiconductor chips, and IC chips.

Figure 9:
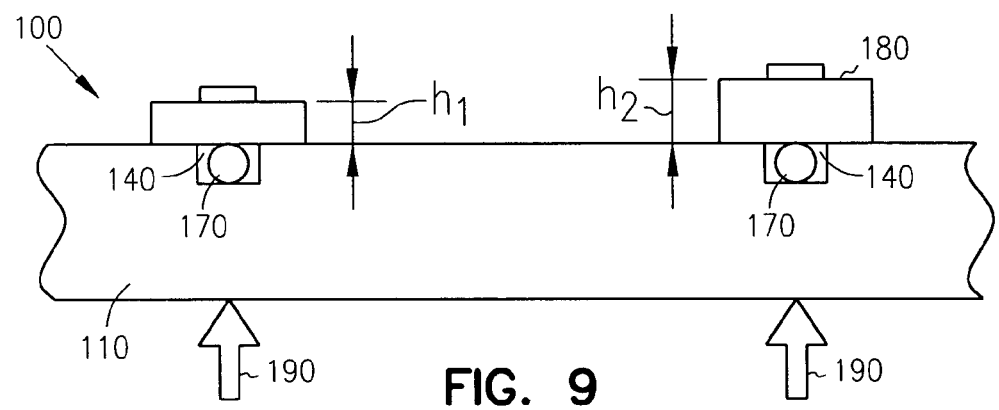

Referring to FIG. 9, each chip 180 is secured to the substrate 110 by curing the dispensed adhesive 170. The dispensed adhesive 170 holds each chip 180 in place after curing the adhesive 170. The adhesive 170 can be cured using a curing process, such as localized thermal curing, UV light curing (when a glass substrate is used), microwave curing, and/or infrared (IR) curing. In some embodiments, as indicated by directional arrows 190 in FIG. 9, localized thermal or UV light curing can be used to cure dispensed adhesive 170 in each cavity 140.

Figure 10:
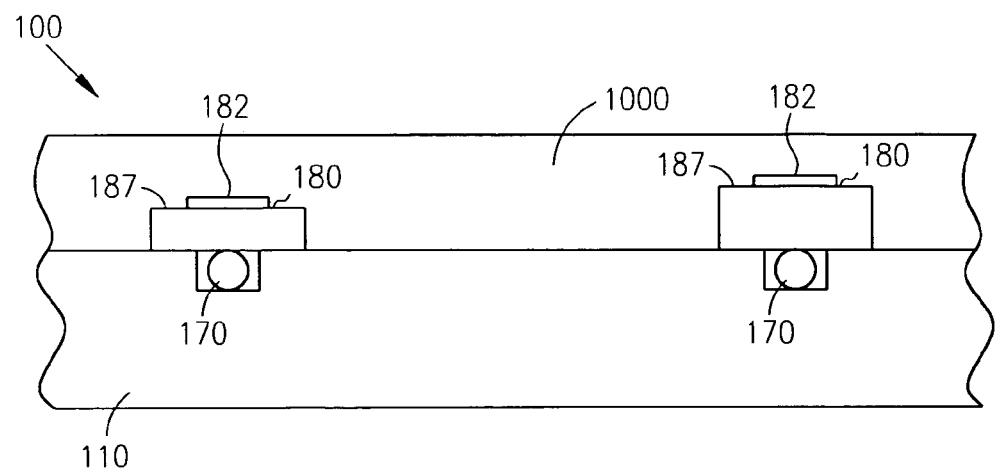

Referring to FIG. 10, after curing the dispensed adhesive 170, an encapsulating layer 1000 is deposited over the top surfaces of the substrate 112 and chips 187. In these embodiments, deposited encapsulating layer 1000 is substantially coplanar with the top surfaces of the substrate 112 and chips 187, because the top surface 187 of each placed chip 180 is substantially coplanar with the top surface 112 of the substrate 110, which results in consistent chip heights 'h$_1$' and 'h$_2$' as shown in FIG. 9. Therefore, only a thin encapsulating layer 1000 is needed over the top surfaces of substrate 112 and chips 187. Thinner encapsulating layer 1000 results in reduced thermal buildup and thermal stress during operation of the multichip module. In addition, variations in the thickness of the deposited encapsulating layer 1000 is considerably reduced due to the substantial coplanarity achieved between the top surfaces of substrate 112 and each of the chips 187. Reduced variation in the thickness of the encapsulating layer 1000 results in reduced variations in dielectric properties and post-processing problems, such as metal deposition rate, varying etch rate, and so on, which can ultimately result in a higher yield.

In some embodiments, encapsulating layer 1000 is a dielectric layer. In these embodiments, the dielectric layer can be formed using photo-patternable dielectric materials, such as polyimide, polyolefin, polynorbornene, Benzyl Cyclo Butane (BCB), and Poly Benzoxyzol (PBO). In these embodiments, dielectric layer 1000 is spray or spin coated over the top surfaces of the substrate 112 and each of the chips 187. The thickness of the dielectric layer can be in the range of 1 to 100 microns over the chip surface 187.

Figure 11:
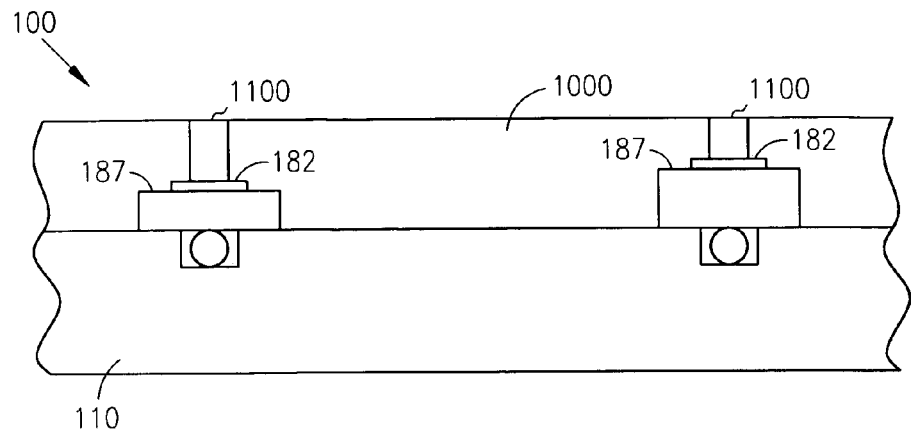

Referring to FIG. 11, via holes 1100 are formed in the dielectric layer 1000 to expose the at least one or more contact pads 182 at the upper surface 187 of each chip 180 for facilitating electrical connection on the dielectric layer 1000. In some embodiments, via holes are formed using an excimer laser.

Figure 12:
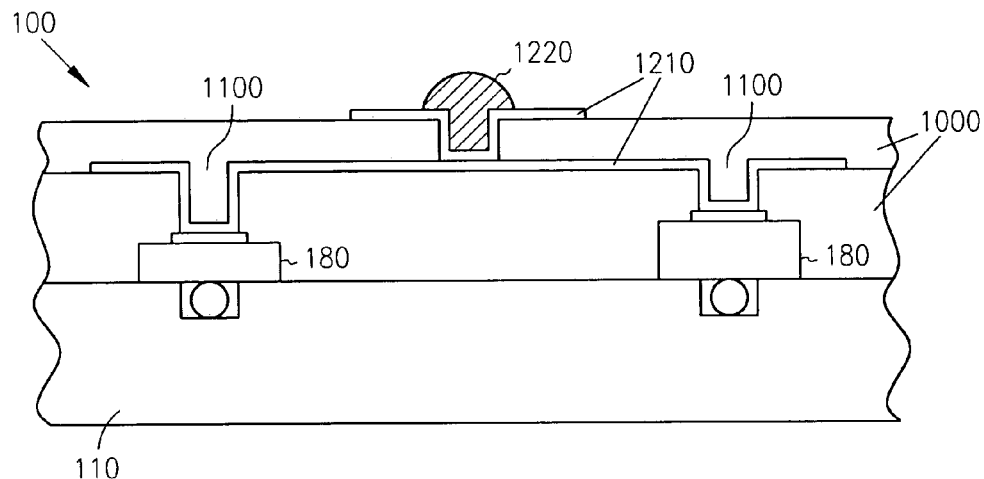

Referring to FIG. 12, metallization structures 1210 are formed over the dielectric layer 1000 and the via holes 1100 to interconnect the chips 180. In some embodiments, chip interconnection metallization structures 1210 are sputtered on the dielectric layer 1000 and via holes 1100. The metallization is subsequently built up electrolytically and patterned by photolithographic means. Additional interconnection layers are then built up as required by depositing dielectric layer 1000, forming via holes 1100, and metallizing structures 1210.

As shown in FIG. 12, input/output (I/O) structures 1220, such as solder bumps and/or gold-plated pad grids are formed over the metallization structures 1210. Gold-plated pad grid is achieved by pattern plating the copper to a thickness of approximately 1 micron or more, followed by plating nickel up to 5 microns and then gold up to 0.5 microns. Solder balls, and/or solder paste cones are placed at each site and reflowed to form the desired solder bumps. Note that solder bumps or connection pads can be placed directly above or offset to the side of the bare chips, thus allowing any desired I/O pad array configuration to be produced for the single packaged chip.

Figure 13:
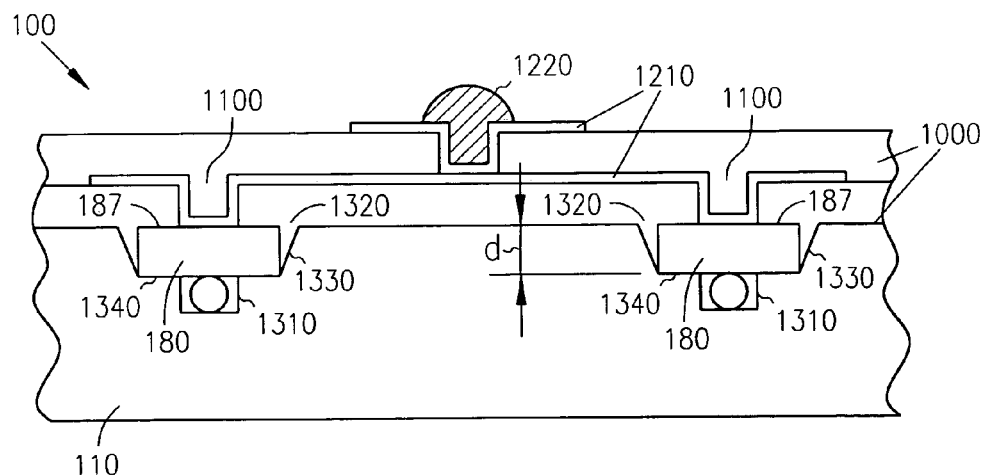
FIG. 13 is a cross-sectional view of a semiconductor wafer fragment that illustrates a multichip module fabricated according to another embodiment of the present invention.

FIG. 13 shows another embodiment in which chips 180 are placed inside a second cavity 1320. In this embodiment, die-attach material is dispensed in an earlier operation in a first cavity 1310. As shown in FIG. 13, first cavity 1310 is disposed below the second cavity 1320. In the embodiment shown in FIG. 13, first cavity 1310 is substantially concentric with the second cavity 1320. It can be envisioned that first cavity 1310 is offset from second cavity 1320. Second cavity 1320 is larger than first cavity 1310, as shown in FIG. 13. A recessed area 1340, similar to a chip placement area around the alignment marks 160 shown in FIGS. 5 and 6, is formed between the first and second cavities 1310 and 1320. The second cavity 1320 is large enough to receive an associated chip 180. In addition, second cavity 1320 has upwardly extending surfaces 1330 that extend from and around the recessed area 1340 as shown in FIG. 13. The upwardly extending surfaces 1330 help in substantially aligning chip 180 in X and Y dimensions during placement of each chip 180 in the second cavity 1320 and over the recessed area 1340.

The embodiment shown in FIG. 13 requires a substantially reduced thickness of the dielectric layer 1000 over the top surfaces of the substrate 112 and each chip 187 as compared to the embodiment shown in FIG. 12. Each chip 180 is placed inside the second cavity 1320 and the chip 180 protrusion beyond the top surface 112 of the substrate 110 can be reduced by controlling the depth 'd' of the second cavity 1320. As described above with reference to FIG. 10, a thinner dielectric layer reduces thermal stress and thermal build-up during operation of the single or multichip module. As shown in FIG. 13, dielectric layers 1000, via holes 1100, and metallizing structures 1210 are formed over the top surface 112 of the substrate 110 as described above with reference to FIGS. 10-12. Additional interconnection layers can then be built up as required by depositing dielectric layers 1000, forming via holes 1100, metallizing and patterning to form metallizing structures 1210.

Figure 14:
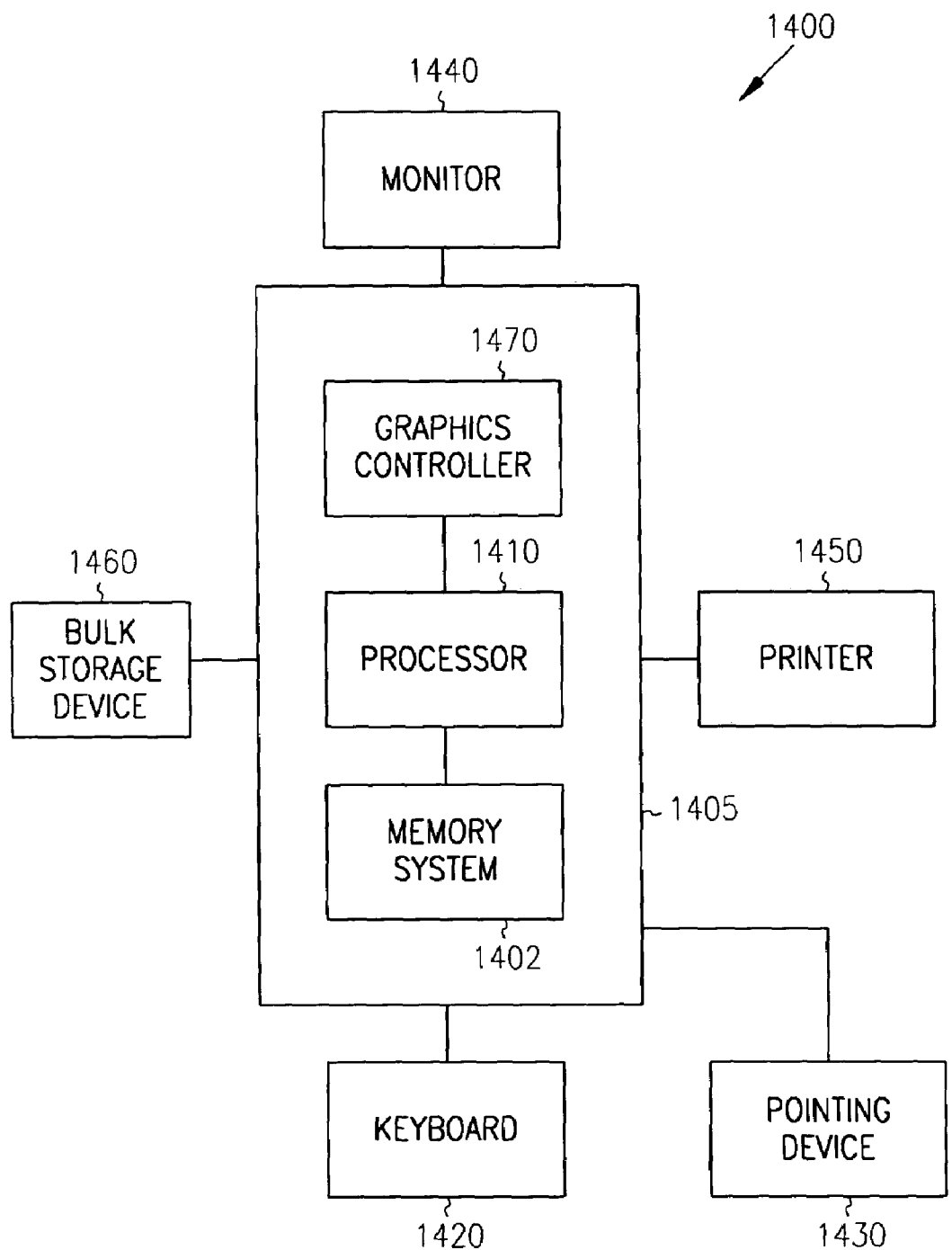
FIG. 14 is a block diagram of an exemplary computer system.

FIG. 14 is a block diagram of a system according to one embodiment of the present invention. Computer system 1400 contains a processor 1410 and a memory system 1402 housed in a computer unit 1405. Computer system 1400 is but one example of an electronic system containing another electronic system, e.g., memory system 1402, as a subcomponent. The memory system 1402 includes a memory device that includes a multichip module as discussed in various embodiments of the present invention. Computer system 1400 optionally contains user interface components. These user interface components include a keyboard 1420, a pointing device 1430, a monitor 1440, a printer 1450, and a bulk storage device 1460. It will be appreciated that other components are often associated with computer system 1400 such as modems, device driver cards, additional storage devices, etc. It will further be appreciated that the processor 1410 and memory system 1402 of computer system 1400 can be incorporated on a single integrated circuit. Such single-package processing units reduce the communication time between the processor and the memory circuit. Any of these components of the system may contain a multichip module that includes the build-up single or multichip module of the present invention. This is particularly true of graphics subsystem 1470 of FIG. 14 utilizing SGRAM that includes the multiple-mode output driver as discussed in various embodiments of the present invention.

Figure 15:
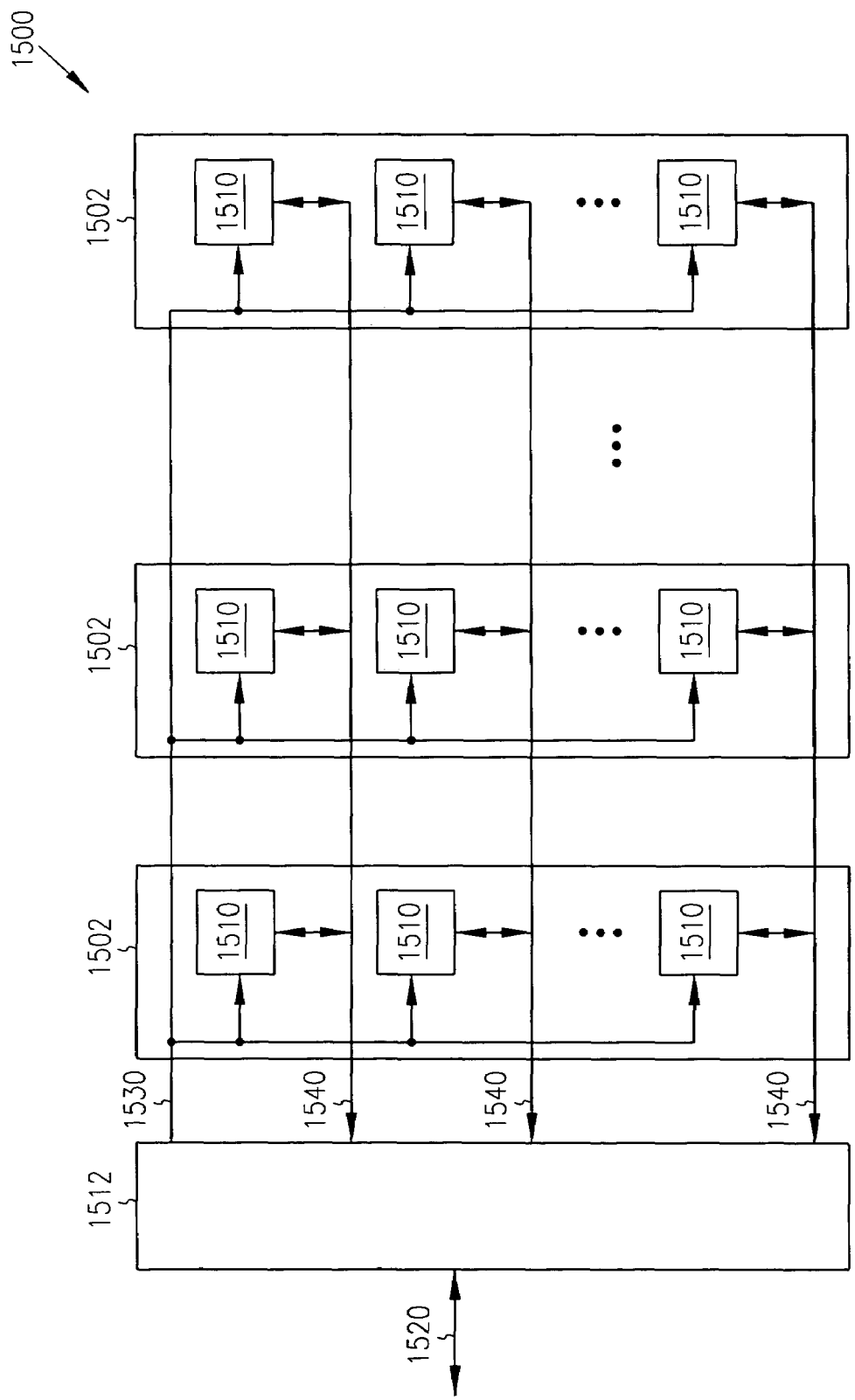
FIG. 15 is a block diagram of an exemplary memory system.
Figure 16:
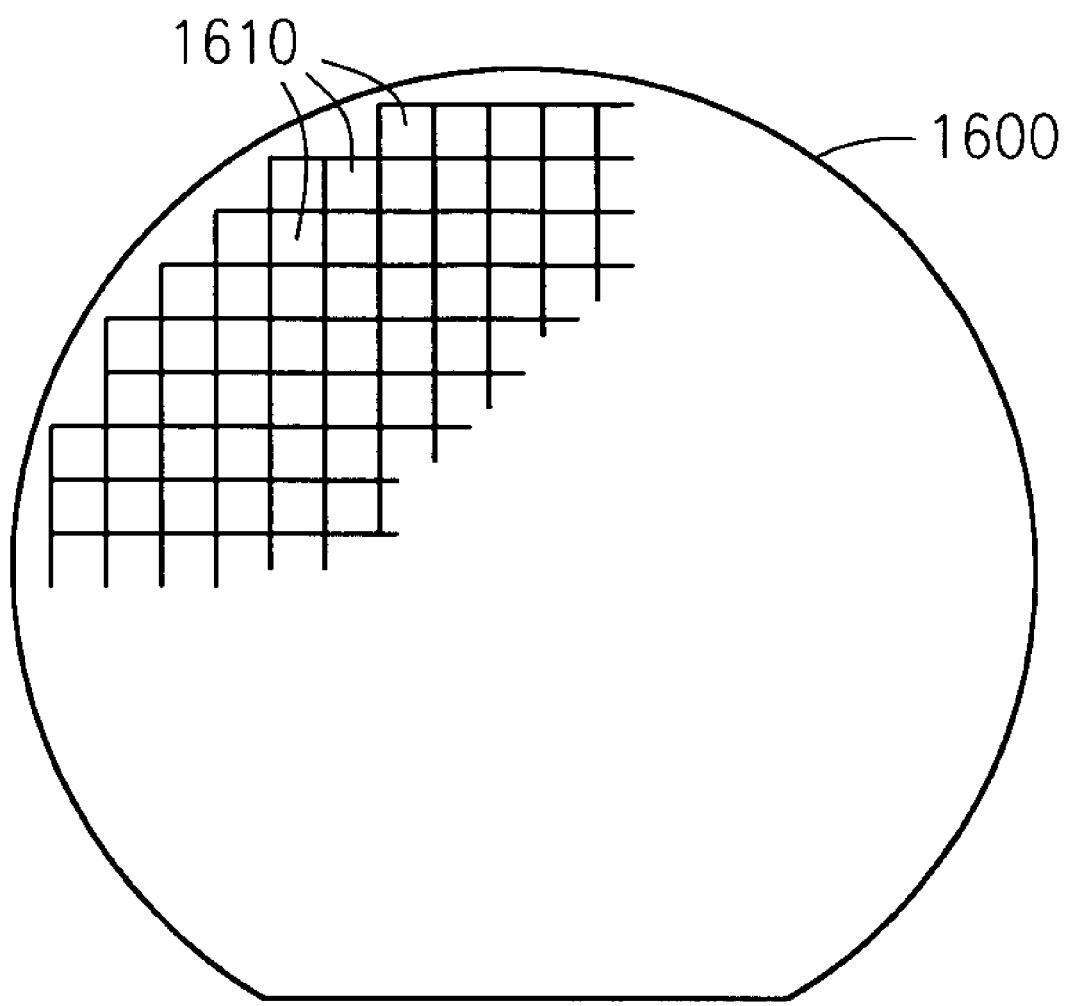
FIG. 16 is an elevational view of a substrate containing semiconductor dies.

FIG. 15 is a block diagram of a system according to one embodiment of the present invention. Memory system 1500 contains one or more multichip modules 1502 and a memory controller 1512. Each memory module 1502 includes at least one memory device 1510. Memory controller 1512 provides and controls a bidirectional interface between memory system 1500 and an external system bus 1520. Memory system 1500 accepts a command signal from the external bus 1520 and relays it to the one or more memory modules 1502 on a command link 1530. Memory system 1500 provides for data input and data output between the one or more memory modules 1502 and external system bus 1520 on data links 1540. At least one of the memory devices 1510 includes the single or multichip modules as discussed in various embodiments of the present invention. At least one of the memory devices 1510 includes the build-up multichip modules of the present invention. With reference to FIG. 16, in one embodiment, a semiconductor die 1610 is produced from a silicon wafer 1600. A die is an individual pattern, typically rectangular, on a substrate that contains circuitry to perform a specific function. A semiconductor wafer will typically contain a repeated pattern of such dies containing the same functionality. Die 1610 may contain multichip modules, as discussed above. Die 1610 may further contain additional circuitry to extend to such complex devices as a monolithic processor with multiple functionality. Die 1610 is typically packaged in single or multichip modules as discussed in various embodiments of the present invention.

The above description illustrates preferred embodiments, which achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed is:

1. A method for fabricating a multichip module including one or more semiconductor dies and a substrate, the substrate having an upper surface, the upper surface of the substrate having one or more pre-etched cavities, each semiconductor die having upper and lower surfaces, the lower surface of the semiconductor die being disposed across from the upper surface of the semiconductor die, comprising:

dispensing die-attach material in each cavity;

placing a semiconductor die over each pre-etched cavity including the die-attach material;

securing the semiconductor die to the upper surface of the substrate by curing the die-attach material; and forming an encapsulating layer including electrical interconnections between at least some of the semiconductor die secured to the one or more pre-etched cavities over the substrate and over the upper surface of each semiconductor die.

2. The method of claim 1, further comprising: providing alignment marks associated with each cavity.

3. The method of claim 2, wherein placing the semiconductor die over the die-attach material further comprises:

placing the semiconductor die over the die-attach material such that the lower surface of the semiconductor die is in contact with the upper surface of the substrate and over the cavity and the die-attach material and the upper surface of the semiconductor die is substantially parallel to the upper surface of the substrate; and substantially simultaneously aligning the semiconductor die using the associated alignment marks.

4. The method of claim 1, wherein the substrate comprises:

a material selected from the group consisting of silica, ceramic, alumina, silicon dioxide, metals, organic materials, and gallium arsenide.

5. The method of claim 1, wherein curing the die-attach material comprises:

curing the die-attach material using methods selected from the group consisting of localized thermal curing, UV light curing, and microwave curing.

6. The method of claim 5, wherein forming the encapsulating layer comprises:

forming a dielectric layer over the substrate and the upper surface of each semiconductor die, the dielectric layer being substantially coplanar with the upper surface of each semiconductor die.

7. A method for fabricating a multichip module including one or more IC chips and a substrate, the substrate having an upper surface, each IC chip having upper and lower surfaces, the lower surface of the IC chip being disposed across from the upper surface of the IC chip, the upper surface of the IC chip having at least one contact pad, comprising:

etching the upper surface of the substrate to provide multiple wells in spatial relation with the upper surface;

dispensing die-attach material in each well;

placing an IC chip over each well including die-attach material by urging the IC chip over the die-attach material until the IC chip is in mechanical contact with the substrate surrounding the well and the upper surface of the IC chip is substantially parallel to the upper surface of the substrate;

attaching the IC chip to the upper surface of the substrate by curing the die-attach material; and forming a dielectric layer including electrical interconnections between at least some of the one or more IC chips over the substrate and over the upper surface of each IC chip.

8. The method of claim 7, further comprising:
forming metallization structures above the dielectric material and the plurality of IC chips to electrically interconnect the at least one contact pad of each IC chip.

9. The method of claim 8, further comprising:
providing alignment marks associated with each well.

10. The method of claim 9, wherein placing the IC chip over the die-attach material further comprises:
substantially simultaneously aligning the IC chip using the associated alignment marks when placing the IC chip over the die-attach material.

11. The method of claim 7, wherein forming the dielectric layer further comprises:
forming a dielectric layer over the substrate and the upper surface of each IC chip such that the dielectric layer is substantially coplanar with the upper surface of each IC chip.

12. The method of claim 11, wherein the dielectric layer is formed using materials selected from the group consisting of polyimide, polyolefin, polynorbornene, BCB, and PBO.

13. A method of forming a multichip module comprising:
providing a substrate having one or more chip implanting areas, the substrate having an upper surface, the one or more chip implanting areas are on the upper surface;
etching a pocket in each chip implanting area;
dispensing die-attach material in each pocket; and
attaching a chip over each chip implanting area by urging the chip over the die-attach material until the chip is coplanar and in mechanical contact with the upper surface of the substrate.

14. The method of claim 13, wherein the substrate further comprises:
an alignment mark associated with each pocket on the upper surface of the substrate.

15. The method of claim 14, further comprising:
aligning the chip substantially simultaneously using the associated alignment mark while attaching the chip over the chip implanting area.

16. The method of claim 13, wherein attaching the chip over each chip implanting area further comprises:
curing the die-attach material to attach the chip over the chip implanting area.

17. The method of claim 16, wherein curing the die-attach material further comprises:
curing the die-attach material using a process selected from the group consisting of localized thermal curing, UV light curing, and microwave curing.

18. The method of claim 13, wherein etching a pocket in each chip implanting area comprises:
forming a photoresist layer over the upper surface of the substrate;
etching the photoresist layer in each chip implanting area to expose the chip implanting area over the upper surface of the substrate by using an etchant selective to the substrate; and
etching the pocket and the associated alignment mark in each exposed chip implanting area such that the pocket and the associated alignment mark are in spaced relation with the upper surface of the substrate.

19. The method of claim 13, wherein the die-attach material comprises:
a material selected from the group consisting of polyimide, polyolefin, and BCB.

20. A method of forming a multichip module comprising:
providing a substrate having one or more chip implanting areas, the substrate having an upper surface, the one or more chip implanting areas are on the upper surface;
etching a pocket in each chip implanting area;
dispensing die-attach material in each pocket;
attaching a chip over each chip implanting area by urging the chip over the die-attach material until the chip is coplanar and in mechanical contact with the upper surface of the substrate; and
wherein dispensing the die-attach material in each pocket comprises:
dispensing about one-half to two-thirds the volume of the pocket of die-attach material in each pocket.

21. The method of claim 20, wherein etching a pocket includes providing alignment marks associated with each cavity.

22. The method of claim 21, wherein attaching a chip over each chip implanting area comprises:
placing the chip over the die-attach material such that the lower surface of the chip is in contact with an upper surface of the substrate and over the pocket and the die-attach material, wherein an upper surface of the chip is essentially coplanar with the upper surface of the substrate; and
substantially simultaneously aligning the semiconductor die using the associated alignment marks.

23. The method of claim 20, wherein the substrate comprises gallium arsenide.

24. The method of claim 20, wherein the substrate comprises organic material.

25. The method of claim 20, wherein attaching a chip comprises curing the die-attach material using methods selected from the group consisting of localized thermal curing, UV light curing, and microwave curing.

26. The method of claim 25, wherein attaching a chip includes forming the encapsulating layer.

27. A method for fabricating a logic circuit comprising:
providing a substrate having an upper surface, the upper surface having multiple cavities in the upper surface;
dispensing die-attach material in each cavity;
placing an IC chip over each cavity including die-attach material by urging the IC chip over the die-attach material until the IC chip is in mechanical contact with the substrate surrounding the cavity, the IC chip having upper and lower surfaces, the lower surface of the IC chip being in contact with the upper surface of the substrate, the upper surface of the IC chip having at least one contact pad;
curing the die-attach material; and
forming a dielectric layer including electrical interconnections between at least some of the IC chips placed over the multiple cavities over the substrate and the upper surface of each IC chip.

28. The method of claim 27, further comprising:
forming metallization structures above the dielectric material and the plurality of IC chips to electrically interconnect the at least one contact pad of each IC chip.

29. The method of claim 28, further comprising:
providing alignment marks associated with each cavity.

30. The method of claim 28, wherein placing the IC chip over the die-attach material further comprises:

substantially simultaneously aligning the IC chip using the associated alignment marks when placing the IC chip over the die-attach material.

31. A method of forming a multichip module on a substrate having a first cavity and a second cavity in one or more chip implanting areas, the substrate having an upper surface, the first cavity being substantially concentric with the second cavity, the second cavity being disposed over the first cavity and below the upper surface, the second cavity being larger than the first cavity such that a recessed area is formed between the first and second cavities, the second cavity further having upwardly extending surfaces from the recessed area and terminating at the upper surface of the substrate, comprising:

dispensing die-attach material in each first cavity;

placing a chip inside each second cavity and over each associated first cavity including die-attach material by urging the chip over the die-attach material until the chip is in contact with the recessed area, each chip having upper and lower surfaces, the lower surface of each chip being in contact with the recessed area, the upper surface of each chip being coplanar with the upper surface of the substrate;

attaching the chip to the substrate by curing the die-attach material; and forming an encapsulating layer over the upper surface of the substrate and the upper surface of each chip such that the encapsulating layer is coplanar with the upper surface of the substrate.

32. The method of claim 31, wherein the upwardly extending surfaces of the second cavity are configured to receive the chip and substantially align the chip when placing the chip in the second cavity.

33. The method of claim 31, wherein curing the die-attach material further comprises:

curing the die-attach material using processes selected from the group consisting of localized thermal curing, UV light curing, and microwave curing.

34. The method of claim 31, wherein the die-attach material comprises:

a material selected from the group consisting of epoxy and adhesive.

35. The method of claim 31, wherein forming the encapsulating layer comprises:

forming a dielectric layer over the upper surface of the substrate and the upper surface of each chip such that the dielectric layer is substantially coplanar with the upper surface of each chip.

36. The method of claim 35, wherein the dielectric layer is formed using a material selected from the group consisting of polyimide, polyolefin, polynorbornene, BCB, and PBO.

37. A method comprising:

providing a substrate having an upper surface, the upper surface having one or more chip implanting areas, each chip implanting area having first and second cavities, the second cavity being disposed over the first cavity and below the upper surface, the second cavity being larger than the first cavity such that a recessed area is formed between the first and second cavities, the second cavity further having upwardly extending surfaces from the recessed area and terminating at the upper surface of the substrate, comprising:

dispensing die-attach material in each first cavity;

placing a chip inside each second cavity and over each associated first cavity including die-attach material by urging the chip over the die-attach material until the chip is in contact with the recessed area, the chip having upper and lower surfaces, the lower surface of each chip being in contact with the recessed area, the upper surface of each chip being coplanar with the upper surface of the substrate, the upper surface of each chip having at least one contact pad;

attaching the chip in each second cavity by curing the die-attach material in each associated first cavity; and forming an encapsulating layer over the upper surface of the substrate and the upper surface of each chip.

38. The method of claim 37, wherein the second cavity is large enough to receive the chip and substantially align the chip using the upwardly extending surfaces of the second cavity.

39. The method of claim 37, wherein forming the dielectric layer comprises:

forming the dielectric layer over the upper surface of the substrate and the upper surface of each chip such that the dielectric layer is substantially coplanar with the upper surface of each chip.

40. The method of claim 39, further comprising:

forming metallization structures above the dielectric layer to electrically interconnect each of the at least one contact pad.

41. The method of claim 40, further comprising:

patterning and forming via holes in the dielectric layer, wherein the via holes are being disposed to expose at least one contact pad at the upper surface of each chip for facilitating electrical interconnection of at least one contact pad of each chip.

42. The method of claim 41, wherein forming the metallization structures comprises:

forming intrachip metallization within the via holes electrically connecting to at least some contact pads exposed by the via holes, wherein intrachip metallization over each chip is isolated from intrachip metallization over each other chip such that the intrachip metallization structures individually fail to electrically interconnect any two chips.

* * * * *